(12) United States Patent
Djordjevic et al.

(10) Patent No.: US 9,367,387 B2
(45) Date of Patent: Jun. 14, 2016

(54) RATE ADAPTIVE IRREGULAR QC-LDPC CODES FROM PAIRWISE BALANCED DESIGNS FOR ULTRA-HIGH-SPEED OPTICAL TRANSPORTS

(71) Applicant: NEC Laboratories America, Inc., Princeton, NJ (US)

(72) Inventors: Ivan B. Djordjevic, Tuscon, AZ (US); Ting Wang, West Windsor, NJ (US)

(73) Assignee: NEC Corporation (JP)

( * ) Notice: Subject to any disclaimer, the term of this patent is extended or adjusted under 35 U.S.C. 154(b) by 178 days.

(21) Appl. No.: 14/162,951

(22) Filed: Jan. 24, 2014

(65) Prior Publication Data

US 2014/0208185 A1    Jul. 24, 2014

Related U.S. Application Data

(60) Provisional application No. 61/756,299, filed on Jan. 24, 2013.

(51) Int. Cl.
| | | |
|---|---|---|
| *H03M 13/00* | (2006.01) | |
| *G06F 11/10* | (2006.01) | |
| *H03M 13/25* | (2006.01) | |
| *H03M 13/11* | (2006.01) | |
| *H03M 13/03* | (2006.01) | |

(52) U.S. Cl.
CPC .............. *G06F 11/10* (2013.01); *H03M 13/033* (2013.01); *H03M 13/112* (2013.01); *H03M 13/116* (2013.01); *H03M 13/1171* (2013.01); *H03M 13/1177* (2013.01); *H03M 13/255* (2013.01)

(58) Field of Classification Search
CPC .......... H03M 13/116; H03M 13/1177; H03M 13/1165; H03M 13/255; H03M 13/1162; H03M 13/1171; H03M 13/112; H03M 13/033; G06F 11/10
USPC ................................................. 714/758, 804
See application file for complete search history.

(56) References Cited

U.S. PATENT DOCUMENTS

| | | | | |
|---|---|---|---|---|
| 8,219,874 | B2 * | 7/2012 | Djordjevic .......... | H03M 13/255 714/755 |
| 8,739,001 | B2 * | 5/2014 | Tsatsaragkos ........ | H03M 13/13 714/755 |
| 8,930,789 | B1 * | 1/2015 | Dave ................ | H03M 13/1137 714/752 |
| 2011/0154151 | A1 * | 6/2011 | Matsumoto ....... | H03M 13/1168 714/752 |

OTHER PUBLICATIONS

Djordjevic, et al., "Irregular Low-Density Parity-Check Codes for Long-Haul Optical Communications" IEEE Photonics Technology Letters., Jan. 2004, vol. 16, pp. 338-340.

(Continued)

*Primary Examiner* — Christine Tu
(74) *Attorney, Agent, or Firm* — Joseph Kolodka

(57) ABSTRACT

Systems and methods for data transport include encoding one or more streams of input data using one or more Quasi-Cyclic Low Density Parity Check (QC-LDPC) encoders; controlling irregularity of the QC-LDPC encoded data while preserving the quasi-cyclic nature of the LDPC encoded data and eliminating the error floor phenomenon. A parity-check matrix may be partially reconfigured to adapt one or more code rates; and one or more signals are generated using a mapper, wherein the output of the mapper is modulated onto a transmission medium. One or more streams of input data are received, and the streams are decoded using one or more QC-LDPC decoders.

11 Claims, 3 Drawing Sheets

120

(56) References Cited

OTHER PUBLICATIONS

Sab, et a., "Block Turbo Code Performances for Long-Haul DWDM Optical Transmission Systems," in Proc. OFC/NFOEC, Mar. 2000, Paper ThS5, pp. 280-282.

Mizuochi, et al., "FPGA Based Prototyping of Next Generation Forward Error Correction," in Proc. ECOC 2009, Sep. 2009, Paper No. 5.4.1, pp. 20-24.

Miyata, et al., "A Triple-Concatenated FEC Using Soft-Decision Decoding for 100 Gb/s Optical Transmission," in OFC/NFOEC, OSA Technical Digest CD-ROM (Optical Society of America, Washington, DC, 2010), OThL3, 3 pages.

Djordjevic, et al., "Large Girth Low-Density Parity-Check Codes for Long-Haul High-Speed Optical Communications," in Proc. OFC 2008, Feb. 24-28, 2008, Paper No. JWA53, SD, USA, pp. 1-3.

Chen et al., "Reduced-Complexity Decoding of LDPC Codes," IEEE Transactions. Communications., vol. 53, Aug. 2005, pp. 1288-1299.

Mizuochi, et al., "FPGA Based Prototyping of Next Generation Forward Error Correction," Symposium: Real-time Digital Signal Processing for Optical Transceivers, ECOC, Sep. 22, 2009, 16:45-17:10.

\* cited by examiner

US 9,367,387 B2

RATE ADAPTIVE IRREGULAR QC-LDPC CODES FROM PAIRWISE BALANCED DESIGNS FOR ULTRA-HIGH-SPEED OPTICAL TRANSPORTS

RELATED APPLICATION INFORMATION

This application claims priority to provisional application Ser. No. 61/756,299 filed on Jan. 24, 2013, incorporated herein by reference.

BACKGROUND

1. Technical Field

The present invention relates to coded modulation, and in particular, to systems and methods for rate adaptive coded-modulation based on irregular quasi-cyclic LDPC codes.

2. Description of the Related Art

As the response to never ending demands for higher data rates and distance independent connectivity, 100 Gb/s Ethernet (GbE) standard has been already adopted, and 400 GbE and 1 TbE have become the research focus of many researchers. IEEE ratified the 40/100 GbE standard IEEE 802.3ba in June 2010. The next upgrade on Ethernet to meet the ever-increasing capacity demands is likely to be 400 Gb/s. As the operating symbol rates increase, the deteriorating effects of fiber nonlinearities and polarization-mode dispersion (PMD) reach levels that inhibit reliable communication over the optical fiber network.

Thus solutions for 100 GbE and beyond need to attain ultra-high transmission speeds in terms of aggregate bit rates while keeping the operating symbol rates low to facilitate nonlinearity and PMD management, which may be accomplished by employing modulation formats with high spectral efficiencies (SE). However, as a signal constellation grows in size to increase its SE, so does the optical signal-to-noise ratio (OSNR) it needs to achieve a particular bit error ratio (BER), and this may be an issue in practice. When, on the other hand, used in combination with strong forward error correction (FEC) codes, the OSNR requirement of the systems employing such high-SE modulation formats may be significantly lowered. As a consequence, schemes that can combine modulation and coding, which are commonly referred to as coded modulation schemes, gain further importance in the design and implementation of high-speed optical communication systems. Furthermore, in the context of high-speed optical communication systems, the complexity of a coded modulation system also plays a crucial role. Thus, such schemes need to be designed meticulously to address both issues simultaneously and effectively.

One of the key enabling technologies for the next generation of optical transport is the soft decision Forward Error Correction (FEC). In particular, it has been shown that the Low Density Parity Check (LDPC) coded modulation based on large girth (e.g., $\geq 10$) LDPC codes provides excellent Bit Error Rate (BER) performance. Unfortunately, the codeword lengths are excessively long for quasi-cyclic (QC) LDPC code design, and corresponding decoders are difficult to implement with currently existing hardware. Furthermore, large girth (e.g., girth-8) LDPC codes exhibit the error floor phenomenon. The error floor phenomenon is encountered in modern iterated sparse graph-based error correcting codes like LDPC codes and turbo codes. When the bit error ratio (BER) is plotted for conventional codes or for convolutional codes, the BER steadily decreases in the form of a curve as the Signal to Noise Ratio (SNR) condition becomes better. For LDPC codes and turbo codes, there exists a point after which the curve does not fall as quickly as before, in other words, there is a region in which performance flattens, and this region is called the error floor region.

Prior attempts to eliminate the error floor phenomenon have used an outer Binary Coded Hexadecimal/Reed-Solomon (BCH/RS) code, and by using this approach, the error floor of girth-8 and girth-6 LDPC codes can be effectively eliminated. However, a disadvantage of using this approach is that the corresponding net coding gains (NCGs) are much below that of large-girth LDPC codes.

SUMMARY

A method for data transport is shown that includes encoding one or more streams of input data using one or more Quasi-Cyclic Low Density Parity Check (QC-LDPC) encoders; controlling irregularity of the QC-LDPC encoded data while preserving the quasi-cyclic nature of the LDPC encoded data and eliminating the error floor phenomenon; partially reconfiguring a parity-check matrix to adapt one or more code rates; generating one or more signals using a mapper, wherein the output of the mapper is modulated onto a transmission medium; receiving the one or more streams of input data; and decoding the one or more streams of input data using one or more QC-LDPC decoders.

A Data transport system is shown that includes one or more encoders configured to encode one or more streams of input data using one or more Quasi-Cyclic Low Density Parity Check (QC-LDPC) encoders; an irregularity control module configured to control irregularity of the QC-LDPC encoded data while preserving the quasi-cyclic nature of the LDPC encoded data and eliminating the error floor phenomenon; one or more decoders configured to partially reconfigure a parity check matrix to adapt one or more code rates; one or more mappers configured to generate one or more signals, wherein the output of the mapper is modulated onto a transmission medium; a receiver configured to receive the one or more streams of input data; and decoding the one or more streams of input data using one or more QC-LDPC decoders.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
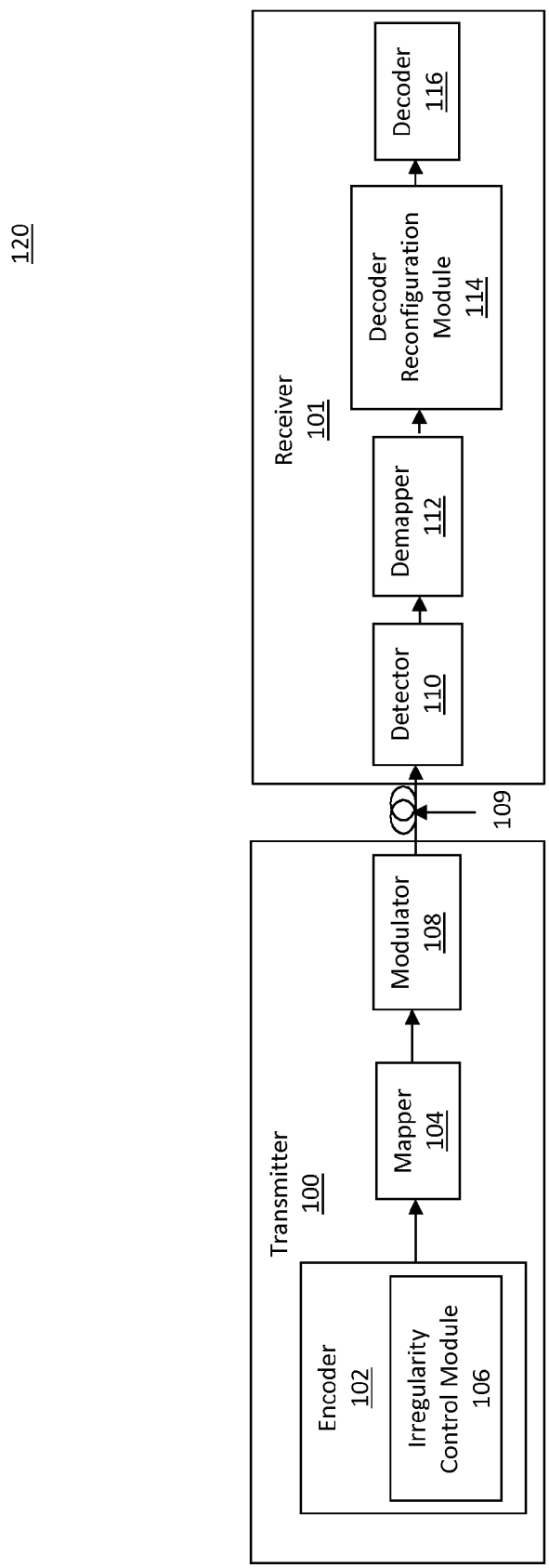
FIG. 1 shows a block diagram illustrating an optical transmission system which includes rate-adaptive irregular QC-LDPC coding according to the present principles.

To eliminate the error floor phenomenon while maintaining high net coding gains (NGCs) during optical transport, irregular Low Density Parity Check (LDPC) codes may be employed according to the present principles. The irregularity may be precisely controlled while preserving the quasi-cyclic nature of LDPC code design so that decoder complexity may also be preserved.

Combinational mathematics objects (e.g., pairwise balanced designs (PBDs)) may be employed to provide such flexibility in code design. The complexity of conventional non-quasi-cyclic irregular LDPC codes, is too high to be of practical importance at ultra-high-speed. Advantageously, according to the present principles, irregular QC-LDPC codes of large girth (e.g., girth-8) may be employed to significantly outperform corresponding regular QC-LDPC codes, while at the same time eliminating the error floor phenomenon. The irregular QC-LDPC coded-modulation method according to the present principles provides a more general framework than regular QC-LDPC codes, and the method according to the present principles provides for a plurality of rate-adaptive LDPC-coded modulation solutions for any modulation format.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Referring now in detail to the figures in which like numerals represent the same or similar elements and initially to FIG. 1, an optical communication system 120 is illustratively shown comprising a transmitter 100 and a receiver 101. Although the transmitter 100 and the receiver 101 are both illustratively shown, one skilled in the art would appreciate that the transmitter 100 or receiver 101 may each be employed separately, or in combination with each other in accordance with the present principles.

In an illustrative embodiment, the details corresponding to either fundamental mode in SMF or one spatial mode in FMF are provided. FMFs are defined as optical fibers that support more than one spatial mode, but fewer spatial modes than conventional multi-mode fibers. While the details corresponding to either fundamental mode in SMF or one spatial mode in FMF are illustratively provided, it is contemplated that other modes may also be employed (e.g., few-core fiber, few-mode-few-core fiber, or multi-mode fiber). The transmitter 100 may encode a plurality of data signals at the encoder block 102 and then maps those signals at a mapping block 104. The LDPC encoder 102 may be either binary or nonbinary. The irregularity controller 106 may control the encoder 102, and may determine the code rate and irregularity pattern. The type of irregularity to employ using the irregularity controller 106 may be determined based on channel conditions (e.g., information obtained by monitoring channel).

The mapping block 104 may assign bits of the signal to a signal constellation and associates the bits of the data signals with signal constellation points. The mapping block 104 may provide the coordinates of the corresponding signal constellation points. In one embodiment, signal generation may be separated into two distinct parts: modulation, which is a discrete set of values called the signal constellation, and pulse shaping to create the pulse waveforms. The size of the constellation determines the maximum information that each symbol can carry, while pulse shaping affects the spectral width occupied by the signal. The signal may then be modulated in block 108, and the transmitter 100 may then send the signal to the receiver 101 over an optical medium 109 (e.g., single-mode fiber, few-mode fiber, few-core fiber, few-mode-few-core fiber, multi-mode fiber, etc.). While the medium is advantageously shown as an optical medium, it is contemplated that other sorts of media may also be employed according to the present principles.

In one embodiment according to the present principles, the receiver 101 detects symbols in the signal constellation in block 110 to recover in-phase and quadrature signals from two or more polarizations/spatial modes, which after analog to digital conversion (ADC) may be down-sampled to represent projections along I- and Q-coordinates. In one embodiment, when FMF is used instead of SMF, a spatial mode demultiplexer (not shown) is employed before detecting block 110. The demapping block (e.g., a posteriori probability (APP) demapping) 112 may calculate symbol log-likelihood ratios (LLRs), which may be used for LDPC decoding.

In one embodiment, irregular QC-LDPC code design may be determined by, for example, letting a set V of size v represent a set of elements (e.g., points), and letting any subset of points be called a block. Then, a pairwise balanced designed (PBD) (v, K, λ) may be defined as a collection of blocks of different sizes taken from set K, such that every pair of points may be contained in λ of the blocks. As a further illustration, if (6, {2,3}, 1) is given as the following collection of blocks: {{0,1,3}, {1,2,4}, {2,3,5}, {0,2}, {1,5}, {3,4}}, then the parity-check matrix of irregular QC-LDPC codes based on PBDs may be given by:

$$H = \begin{bmatrix} g(b_{00})I & g(b_{10})I & g(b_{20})I & \ldots & g(b_{c-1,0})I \\ g(b_{01})I & g(b_{11})P^{S[1]} & g(b_{21})P^{S[2]} & \ldots & g(b_{c-1,1})P^{S[c-1]} \\ g(b_{02})I & g(b_{12})P^{2S[2]} & g(b_{22})P^{2S[2]} & \ldots & g(b_{c-1,2})P^{2S[c-1]} \\ \ldots & \ldots & \ldots & \ldots & \ldots \\ g(b_{0,r-1})I & g(b_{1,r-1}) & g(b_{2,r-1}) & \ldots & g(b_{c-1,r-1}) \\ \square & P^{(r-1)S[1]} & P^{(r-1)S[2]} & & P^{(r-1)S[c-1]} \end{bmatrix},$$

where I is a B×B (B is a prime number) identity matrix, P is a B×B permutation matrix given by $P=(p_{ij})_{B \times B}, p_{i,i+1}=p_{B,1}=1$ (zero otherwise), and r and c represent the number of block-rows and block-columns in the above parity-check matrix, respectively.

In the above parity-check matrix, $\{b_{ij}\}$ are points of the i-th block in PBD (r, K,1) with the largest size of block k in set of sizes K satisfying the inequality k≤r. The $g(b_{ij})$ denotes the indicator function, which may have the value 1 for the existing point within the i-th block, and 0 for the non-existing point. Therefore, only those submatrices for which the indicator function is 1 will be preserved from the template (e.g., regular QC-LDPC code design). Given the fact that PBDs may have regular mathematical structure that can be algebraically described, the irregular QC-LDPC codes derived on PBDs may have the complexity comparable or lower to that of regular QC-LDPC code design.

In one embodiment, the irregular QC-LDPC code derived from PBD(6, {2,3},1) may have the following form:

$$H = \begin{bmatrix} g(0)I & 0 \cdot I & 0 \cdot I & g(0)I & 0 \cdot I & 0 \cdot I \\ g(1)I & g(1)P^{S[1]} & 0 \cdot P^{S[2]} & 0 \cdot P^{S[3]} & g(1)P^{S[4]} & 0 \cdot P^{S[5]} \\ 0 \cdot I & g(2)P^{2S[1]} & g(2)P^{2S[2]} & g(2)P^{2S[3]} & 0 \cdot P^{2S[4]} & 0 \cdot P^{2S[5]} \\ g(3)I & 0 \cdot P^{3S[1]} & g(3)P^{3S[2]} & 0 \cdot P^{3S[3]} & 0 \cdot P^{3S[4]} & g(3)P^{3S[5]} \\ 0 \cdot I & g(4)P^{4S[1]} & 0 \cdot P^{S(2)} & 0 \cdot P^{S(3)} & 0 \cdot P^{S(4)} & g(4)p^{S[5]} \\ 0 \cdot I & 0 \cdot P^{5S[1]} & g(5)P^{5S[2]} & 0 \cdot P^{5S[3]} & g(5)P^{5S[4]} & 0 \cdot P^{5S[5]} \end{bmatrix} =$$

$$\begin{bmatrix} I & 0 & 0 & I & 0 & 0 \\ I & P^{S[1]} & 0 & 0 & P^{S[4]} & 0 \\ 0 & P^{2S[1]} & P^{2S[2]} & P^{2S[3]} & 0 & 0 \\ I & 0 & P^{3S[2]} & 0 & 0 & P^{3S[5]} \\ 0 & P^{4S[1]} & 0 & 0 & 0 & P^{S[5]} \\ 0 & 0 & P^{5S[2]} & 0 & P^{5S[4]} & 0 \end{bmatrix}$$

Since both the identity matrix and the power of permutation matrix may have a single 1 per row, the block size of the i-th block from PBD may determine the i-th block-column weight. In the example above, the first three block-columns have column-weight 3, while the last 3 have the column-weight 2.

The code rate adaptation may be performed by partial reconfiguration of the decoder based on the above parity-check matrix of irregular QC-LDPC codes based on PBDs by changing the size of the permutation matrix P and/or varying the number of employed block-rows, while keeping code word length fixed. Another alternative to changing code rate may be to use the same regular parity-check matrix as template but to employ the PBDs corresponding to different code rates. It is noted that the present principles may be applied to any type of irregular QC-LDPC codes (e.g., non-binary, binary), and the present principles may be employed in both multi-level and multi-dimensional coded-modulations. While an irregular QC-LDPC code derived from PBD (6, {2,3},1) is illustratively shown, it is contemplated that other sorts of data sets and types of LDPC codes may also be employed in accordance with the present principles.

The signals may be decoded at block 116 to produce the original data signals. Although the transmitter 100 and receiver 101 are both illustratively shown, one skilled in the art would appreciate that the transmitter 100 or receiver 101 may each be employed separately, or in combination with each other in accordance with the present principles. In one embodiment, the transmitter may interleave and encode a plurality of data signals at the encoder block 102 and then may map those signals at the mapping block 104. The mapping block 104 may then assign bits of the signal (e.g., interleaved signal) to an iterative polarization modulation constellation, associating the bits of the data signals (e.g., interleaved data signals) with the points on an iterative polar quantization (IPQ) constellation. Alternatively the optimum signal constellation design (OSCD), achieving channel capacity can be used. Moreover, conventional modulation formats such as QAM or PSK can be used as well. The transmitter 100 may then send the signal to receiver 101 over an optical medium 109, which may include periodically deployed erbium doped fiber (EDF) amplifiers (not shown) to maintain the signal strength. Other embodiments may include the use of Raman and hybrid Raman/EDF amplifiers. Receiver 101 detects symbols in the IPQ/OSCD/QAM constellation at block 110. The signals may then be de-interleaved and decoded at block 116.

The encoders and decoders may make use of LDPC codes to provide error correction that brings the transmissions close to the channel capacity. Every communications channel has a channel capacity, defined as the maximum information rate that the communication channel can carry within a given bandwidth. LDPC codes employ iterative belief propagation techniques that enable decoding in time that is proportional to their block length. However, partial reconfiguration of the parity matrix in block 114 can greatly affect the effectiveness of the LDPC code. For example, in a situation where channel conditions are good, the code rate may be weaker, while in situations where channel conditions are bad, the code rate may be stronger than in typical conditions.

Figure 2:
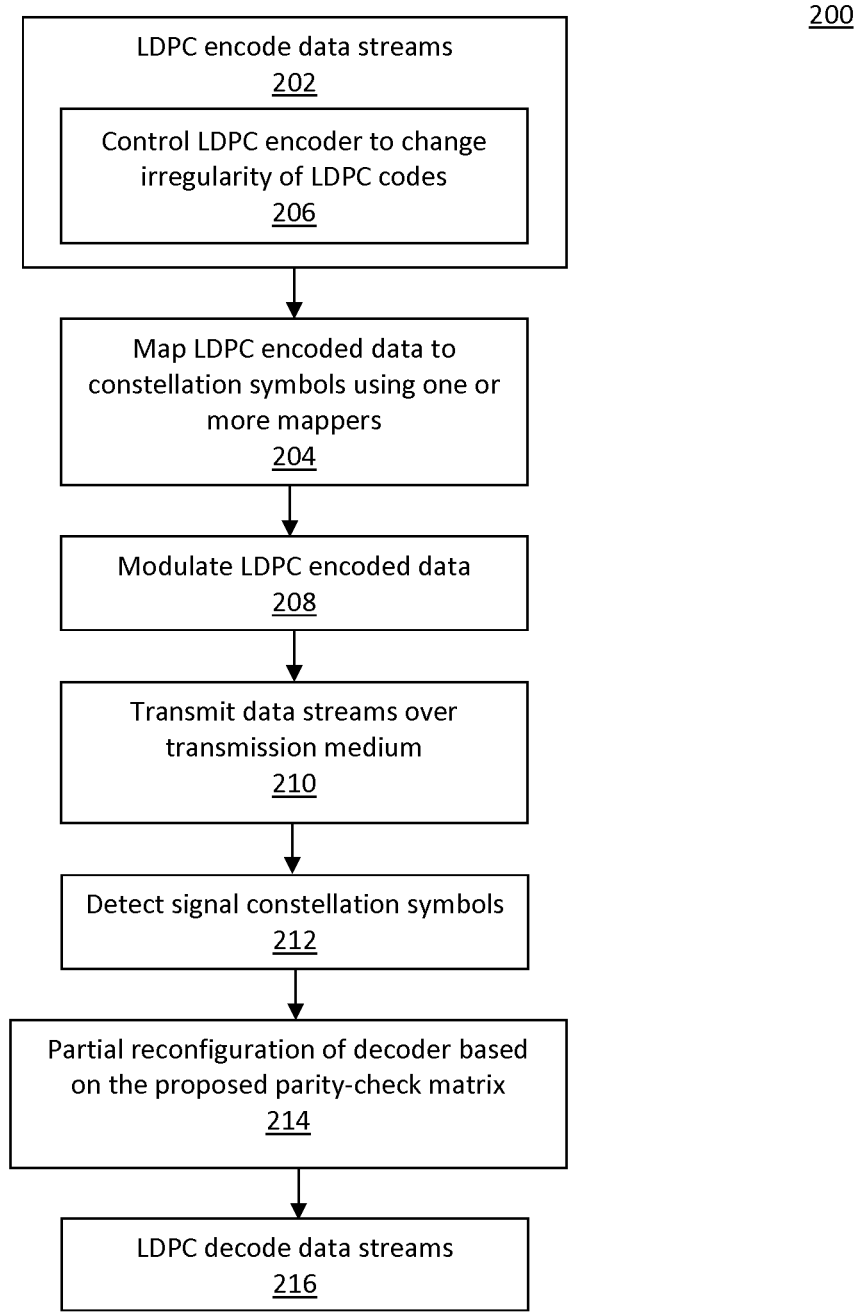
FIG. 2 shows a block/flow diagram illustrating a system/method for transmitting data using irregular LDPC codes according to the present principles.

Referring now to FIG. 2, a rate-adaptive coded-modulation method 200 based on irregular Quasi-Cyclic Low-Density Parity Check (QC-LDPC) codes from Pairwise Balanced Design (PBD) is illustratively depicted according to the present principles. The present principles provide for very high transmission rates (e.g., in excess of 400 Gb/s, in excess of 1 Tb/s, etc.), and effectively eliminate the error floor phenomenon. In one embodiment, data streams are LDPC encoded in block 202, and the LDPC encoded data may be mapped to constellation symbols using one or more mappers in block 204. The irregularity of LDPC may be controlled in block 206 by employing PBD, wherein sets of blocks of different sizes may be used, and the quasi-cyclic nature of LDPC code design may be preserved so that decoder complexity may also be preserved. PBD may employ combinatorial mathematics objects, and may provide flexibility in code design. The size of the blocks may determine which ones will be preserved from the template and which ones will be converted (e.g., converted to zero). The LDPC encoded data may be modulated in block 208, and the data streams may be transmitted over a transmission medium (e.g., fiber) in block 210.

In one embodiment, a receiver may detect signal constellation signals in block 212, and partial reconfiguration of the decoder proposed parity-check matrix may occur in block 214, and the data streams may be LDPC decoded in block 216. The complexity of conventional irregular LDPC codes, non-quasi-cyclic-ones, is generally too high to be of practical importance at ultra-high-speed. However, by employing the present principles, irregular QC-LDPC codes of, for example, girth-8 of reasonable length, significantly outperform the corresponding regular QC-LDPC codes and at the same time eliminate the error floor phenomenon.

In one embodiment, a modified min-sum-plus-correction-term algorithm that further improves the BER performance of LDPC codes may also be employed according to the present principles. In another embodiment, the code rate adaptation may be performed by partial reconfiguration of the decoder proposed parity-check matrix, by changing the size of permutation matrix P and/or by varying the number of employed block-rows, while keeping code word length fixed. In another embodiment, as an alternative to the above method to change code rate, the same regular parity-check matrix as the template may be employed, but PBDs corresponding to different code rates may be used according to the present principles. Concepts of information theory may also be employed to determine optimum distribution, and by controlling the irregularity by employing PBDs in block 206, hardware does not need to be changed during execution of the method according to the present principles.

In one embodiment, a Tanner graph of an (n, k) LDPC code may be drawn according to the following rule: check node c is connected to variable node v whenever element $h_{cv}$ in the parity-check matrix H equals 1. For v-node v (c-node c), the neighborhood N(v) (N(c)) may be defined as the set of c-nodes (v-nodes) connected to it. One embodiment of the decoding method, including the modified min-sum-with-correction-term method, may be summarized as follows:

1. Initialization: For v=0, 1, . . . , n−1; i the variable reliabilities L(v) to channel log-likelihood ratios (LLRs) $L_{ch}(v)$, namely $L(v)=L_{ch}(v)$ may be initialized. The messages $L_{c \rightarrow v}$ to be sent from c-node c to v-node v to zero, that is $L_{c \rightarrow v}=0$, may also be initialized. The channel LLR may be defined by $L_{ch}(v)=\log [P(v=0|y)/P(v=1|y)]$, where y is the channel sample. For example, for asymmetric AWGN channel, in one embodiment, $L_{ch}(v)=\log (\sigma_1/\sigma_0)-(y-u_0)^2/2\sigma_0^2+(y-u_1)^2/2\sigma_1^2$, while for symmetric AWGN=$(\sigma_1=\sigma_0=\sigma)$ channel $L_{ch}(v)=2y/\sigma^2$, where $u_i$ and $\sigma_i$, the mean value and standard deviation corresponding to symbol i may be denoted as (i=0,1).
2. v-node update rule: For v=0, 1, . . . , n−1; set $L_{v \rightarrow c}=L(v)-L_{c \rightarrow v}$ for all c-nodes for which $h_{cv}=1$.
3. The c-node update rule: For c=0, 1, . . . , n−k; compute $$L_{c \rightarrow v} = \boxplus_{N(c) \setminus \{v\}} L_{v \rightarrow c}.$$

The box-plus operator may be defined by $$L_1 \boxplus L_2 = \prod_{k=1}^{2} \operatorname{sign}(L_k) \cdot \min(|L_1|, |L_2|) + c(x, y),$$

where $c(x,y)=\log [1+\exp(-|x+y|)]-\log [1+\exp(-|x-y|)]$. The box operator for $|N(c) \setminus \{v\}|$ components may be obtained by recursively applying the 2-component version discussed above.

4. Bit decisions: L(v)(v=0, . . . , n−1) may be updated by $$L(v) = L_{ch}(v) + \sum_{N(v)} L_{c \rightarrow v}$$

and may set $\hat{v}=1$ when L(v)<0 (otherwise, $\hat{v}=0$), where $\hat{v}$ is the estimate of a variable node v.

5. If, $\hat{v}H^T=0$ or a pre-determined number of iterations has been reached then the process may stop, otherwise the above steps may be iterated beginning with step 1.

Figure 3:
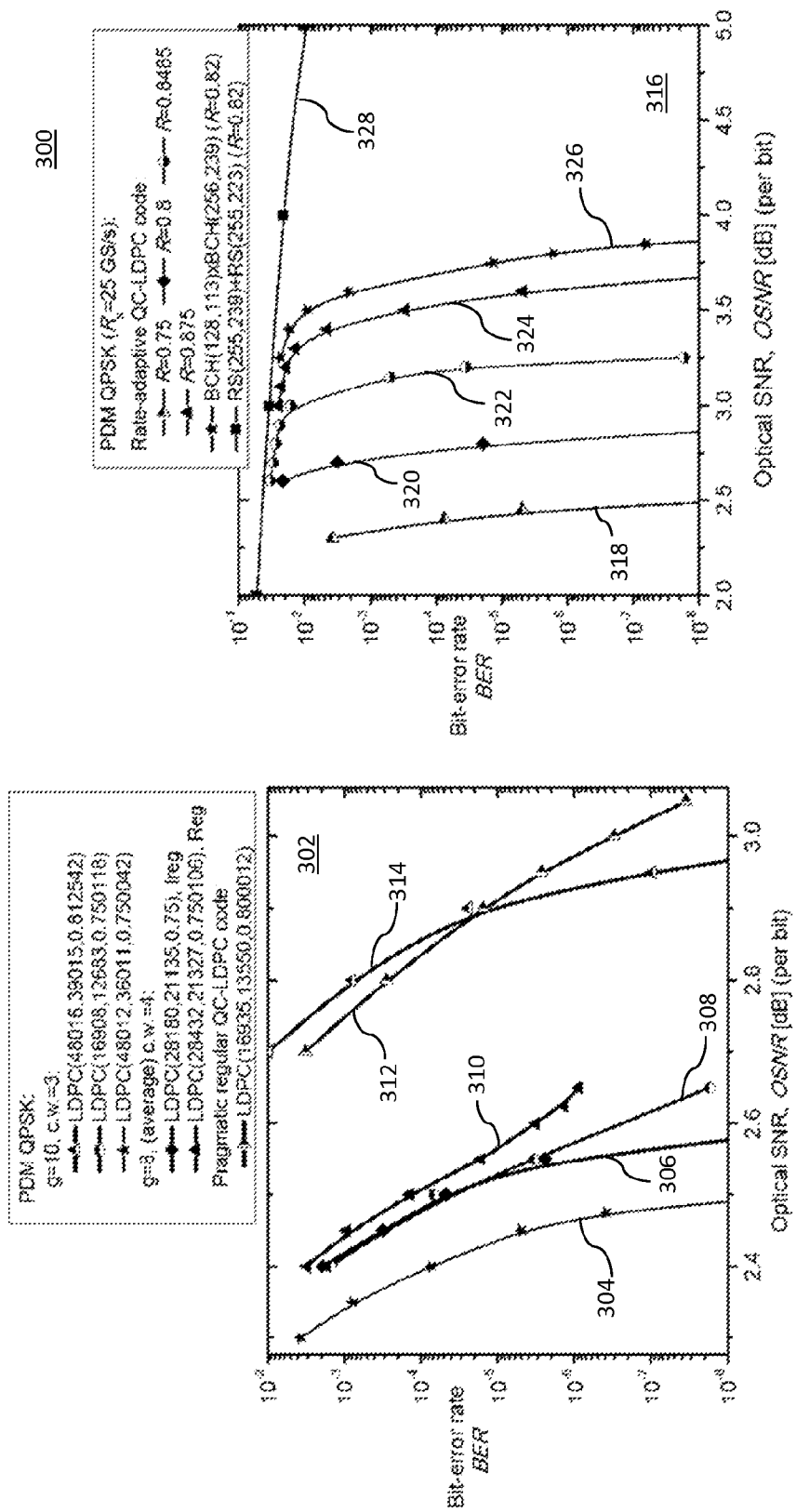
FIG. 3 shows plots of bit error rate (BER) versus signal to noise ratio (SNR) for performance of irregular QC-LDPC codes according to the present principles.

Referring now to FIG. 3, plots of bit error rate (BER) versus signal to noise ratio (SNR) for performance 302, 316 are illustratively depicted according to the present principles. The plots may represent polarization-division multiplexed (e.g., PDM) Quadrature Phase Shift Keying (QPSK) of aggregate date information rate of 100 Gb/s and 50 iterations in min-sum-plus-correction-term method (discussed above). A comparison of employing irregular QC-LDPC codes according to the present principles is evaluated against the corresponding regular QC-LDPC codes in block 302. The girth-8 regular QC-LDPC (28432,21327) code of column-weight 4 (plot 310) exhibits the error floor phenomenon. In contrast, the corresponding irregular QC-LDPC (28180,21135) according to the present principles (plot 306) does not exhibit the error floor phenomenon, and it provides the NCG of 9.7 dB at BER of $10^{-8}$, although the expected NCG at BER of $10^{-15}$ is 12.7 dB.

In one embodiment, the above girth-8 irregular LDPC codes perform only 0.08 dB worse than longer girth-10 regular QC-LDPC (48012,36011) code (plot 304), and outperforms regular girth-10 LDPC (16908,12683) codes (plot 308). Clearly, the above irregular QC-LDPC code according to the present principles outperforms pragmatic QC-LDPC (16935,13550) code (plot 312) by 0.5 dB. Finally, the above irregular QCLDPC code according to the present principles outperforms longer regular girth-10 LDPC (48016,39015) codes (plot 314) by 0.39 dB.

In one embodiment, the irregular QC-LDPC code design according to the present principles is employed for rate-adaptation in block 316. The QC-LDPC code design, (discussed above) of length 48000 is used as an illustration. It is evident that QC-LDPC codes of rates ranging from 0.75-0.85 (plots 318, 320, 322, 324) out-perform turbo-product codes of rate 0.82 (plot 326), and significantly outperform concatenated RS code of rate 0.82 (plot 328). As such, it is clear that the rate adaptive coded modulation scheme based on irregular QC-LDPC codes from PBDs according to the present principles outperforms the corresponding scheme based on regular LDPC codes, and eliminates the error floor phenomenon of regular LDPC codes. The irregular QC-LDPC (28180, 21135) code (plot 306) may provide the Net Coding Gain (NCG) of 12.7 dB at BER of $10^{-15}$.

The above presented principles may be generalized as non-binary irregular QC-LDPC codes as follows. The parity-check matrix of irregular NB QC-LDPC codes based on PBDs may be given by:

$$H = \begin{bmatrix} \alpha^0 g(b_{00})I & \alpha^1 g(b_{10})I & \ldots & \alpha^{c-1} g(b_{c-1,0})I \\ \alpha^{c-1} g(b_{01})I & \alpha^0 g(b_{11})P^{S[1]} & \ldots & \alpha^{c-2} g(b_{c-1,1})P^{S[c-1]} \\ \alpha^{c-2} g(b_{02})I & \alpha^{c-1} g(b_{12})P^{2S[1]} & \ldots & \alpha^{c-3} g(b_{c-1,2})P^{2S[c-1]} \\ \vdots & \vdots & \ddots & \vdots \\ \alpha^{c-(r-1)} & \alpha^{c-r+2} & \ldots & \alpha^{c-r} \\ g(b_{0,r-1})I & g(b_{1,r-1})P^{(r-1)S[1]} & & g(b_{c-1,r-1})P^{(r-1)S[c-1]} \end{bmatrix},$$

where I is B×B (B is a prime number) identity matrix, P is B×B permutation matrix given by $P=(p_{ij})_{B \times B}$, $p_{i,i+1}=p_{B,1}=1$ (zero otherwise); and r and c represent the number of block-rows and block-columns in (1), respectively. In the equation above, $\{b_{ij}\}$ are points of the i-th block in PBD(r,K,1), with the largest size of block k in set of sizes K satisfying the inequality k≤r. $\alpha^i$ are nonzero elements of GF(q). Finally, the $\mathcal{I}$ ($b_{ij}$) denotes the indicator function, which has the value 1 for the existing point within the i-th block, and 0 for the non-existing point. Therefore, only those submatrices for which indicator function is 1 will be preserved from template, regular, QC-LDPC code design. Given the fact that PBDs have regular mathematical structure that can be algebraically described, the irregular NB QC-LDPC codes derived from PBDs have the complexity comparable or lower to that of regular NB QC-LDPC code design.

In one embodiment, the irregular NB QC-LDPC code derived from PBD(6,{2,3},1)={{0,1,3}, {1,2,4}, {2,3,5}, {0,2}, {1,5}, {3,4}} may have the following form:

$$H = \begin{bmatrix} \alpha^0 I & 0 & 0 & \alpha^3 I & 0 & 0 \\ \alpha^5 I & \alpha^0 P^{S[1]} & 0 & 0 & \alpha^3 P^{S[4]} & 0 \\ 0 & \alpha^5 P^{2S[1]} & \alpha^0 P^{2S[2]} & \alpha^1 P^{2S[3]} & 0 & 0 \\ \alpha^3 I & 0 & \alpha^5 P^{3S[2]} & 0 & 0 & \alpha^2 P^{3S[5]} \\ 0 & \alpha^3 P^{4S[1]} & 0 & 0 & 0 & \alpha^1 P^{S[5]} \\ 0 & 0 & \alpha^3 P^{5S[2]} & 0 & \alpha^5 P^{5S[4]} & 0 \end{bmatrix}.$$

Since both the identity matrix and the power of permutation matrix may have a single 1 per row, the block size of the i-th block from PBD determines i-th block-column weight. In the example above, the first three block-columns have column-weight 3, while the last 3 have the column-weight 2. Notice that for GF(4)={0,1,$\alpha$,$\alpha^2$}, we have that $\alpha^3$=1, $\alpha^4$=$\alpha$, and $\alpha^5$=$\alpha^2$.

Having described preferred embodiments of a system and method for rate adaptive coded-modulation based on irregular quasi-cyclic LDPC codes (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for data transport, comprising:
   within a transmitter:
      encoding one or more streams of input data using one or more Quasi-Cyclic Low Density Parity Check (QC-LDPC) encoders;
      controlling irregularity of the QC-LDPC encoded data with a set of points having size v and one or more blocks being a subset of the set of points;
      determining a pairwise balanced designed (PBD) (v, K, $\lambda$) as a collection of blocks of different sizes taken from a set of points K such that every pair of points is contained in $\lambda$ of the blocks;
      partially reconfiguring a parity check matrix to adapt one or more code rates for partial reconfiguration of one or more of a first group of QC-LDPC decoders based on the above-parity-check matrix of irregular QC-LDPC codes based on PBDs by changing a size of the permutation matrix P or varying the number of employed block-rows, while keeping code word length fixed to generate one or more mapped signals;
      modulating the one or more mapped signals and sending the one or more modulated signals onto a transmission medium; and
   within a receiver:
      decoding, by one or more of a second group of QC-LDPC decoders the one or more modulated signals from the transmission medium.

2. The method as recited in claim 1, wherein the partial reconfiguration of the parity check matrix includes maintaining a same regular parity-check matrix as a template while employing Pairwise Balanced Designs (PBDs) corresponding to different code rates.

3. The method as recited in claim 1, wherein the partial reconfiguration of the parity check matrix includes employing a min-sum-plus-correction-term decoding.

4. The method as recited in claim 1, wherein the transmission medium is one or more of single-mode fiber (SMF), few-mode fiber (FMF), few-core fiber (FCF), and few-mode-few-core fiber (FMFCF).

5. The method as recited in claim 1, wherein the Quasi-Cyclic Low Density Parity Check (QC-LDPC) encoders are one of binary or non-binary QC-LDPC encoders.

6. A system for data transport, comprising:
   one or more encoders configured to encode one or more streams of input data using one or more Quasi-Cyclic Low Density Parity Check (QC-LDPC) encoders;
   an irregularity control module configured to control irregularity of the QC-LDPC encoded data with a set of points having size v and one or more blocks being a subset of the set of points;
   a pairwise balanced design (PBD) module as a collection of blocks of different sizes taken from a set of points K such that every pair of points is contained in $\lambda$ of the blocks;
   one or more of a first group of QC-LDPC decoders coupled to the PBD module and configured to partially reconfigure a parity check matrix to adapt one or more code rates;
   one or more mappers receiving the reconfigured parity check matrix and configured to generate one or more mapped signals, wherein the mapped signals of the mapper is modulated onto a transmission medium;
   a receiver configured to receive the mapped signals as one or more streams of input data and to decode the one or more streams of input data using one or more of a second group of QC-LDPC decoders.

7. The system as recited in claim 6, wherein the partial reconfiguration of the parity check matrix includes at least one of changing the size of a permutation matrix and varying the number of block-rows with fixed code word length.

8. The system as recited in claim 6, wherein the partial reconfiguration of the parity check matrix includes maintaining a same regular parity-check matrix as a template while employing Pairwise Balanced Designs (PBDs) corresponding to different code rates.

9. The system as recited in claim 6, wherein the partial reconfiguration of the parity check matrix includes employing a min-sum-plus-correction-term decoding.

10. The system as recited in claim 6, wherein the transmission medium is one or more of single-mode fiber (SMF), few-mode fiber (FMF), few-core fiber (FCF), and few-mode-few-core fiber (FMFCF).

11. The system as recited in claim 6, wherein the Quasi-Cyclic Low Density Parity Check (QC-LDPC) encoders are binary or non-binary QC-LDPC encoders.

* * * * *